United States Patent
Chang (10) Patent No.: US 11,626,177 B1
(45) Date of Patent: Apr. 11, 2023

(54) ANTI-FUSE SENSING DEVICE AND OPERATION METHOD THEREOF

(71) Applicant: NANYA TECHNOLOGY CORPORATION, New Taipei (TW)

(72) Inventor: Chih-Hang Chang, Hsinchu (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 0 days.

(21) Appl. No.: 17/560,287

(22) Filed: Dec. 23, 2021

(51) Int. Cl.
*G11C 17/16* (2006.01)
*G11C 17/18* (2006.01)
*G11C 29/02* (2006.01)

(52) U.S. Cl.
CPC .............. *G11C 17/18* (2013.01); *G11C 17/16* (2013.01); *G11C 29/027* (2013.01)

(58) Field of Classification Search
CPC ........................................................ G11C 17/16
USPC ........................................................ 365/225.7
See application file for complete search history.

(56) References Cited

U.S. PATENT DOCUMENTS

| | | | |
|---|---|---|---|
| 5,231,316 A | 7/1993 | Thelen, Jr. | |
| 7,618,186 B2 | 11/2009 | Kwon et al. | |
| 2007/0053236 A1* | 3/2007 | Vogelsang | G11C 29/50008 365/96 |
| 2013/0223171 A1* | 8/2013 | Kim | G11C 29/789 365/200 |
| 2015/0255169 A1* | 9/2015 | Sakamoto | G11C 29/789 327/525 |
| 2018/0294017 A1* | 10/2018 | Chen | G11C 7/1051 |
| 2019/0311773 A1* | 10/2019 | Jimenez-Olivares | G11C 5/147 |

FOREIGN PATENT DOCUMENTS

| | | |
|---|---|---|
| EP | 3252777 | 12/2017 |
| WO | 2017146888 | 8/2017 |

OTHER PUBLICATIONS

"Office Action of Taiwan Counterpart Application", dated Jan. 4, 2023, p. 1-p. 4.

* cited by examiner

*Primary Examiner* — Muna A Techane
(74) *Attorney, Agent, or Firm* — JCIPRNET (57) ABSTRACT

An anti-fuse sensing device and an operation method thereof are provided. The anti-fuse sensing device is adapted for sensing a resistance state of an anti-fuse. The anti-fuse sensing device includes a voltage generating circuit, a comparison circuit, and a sensing circuit. The voltage generating circuit is configured to generate a comparison voltage that changes with temperature. The comparison circuit is coupled to the voltage generating circuit to receive the comparison voltage. The comparison circuit is configured to compare the comparison voltage with a reference voltage, and convert a difference between the comparison voltage and the reference voltage into a bias voltage that changes with temperature. The sensing circuit is coupled to the comparison circuit to receive the bias voltage. The sensing circuit is configured to sense the resistance state of the anti-fuse according to the bias voltage.

16 Claims, 5 Drawing Sheets

ANTI-FUSE SENSING DEVICE AND OPERATION METHOD THEREOF

BACKGROUND

Technical Field

The disclosure relates to an electronic circuit. Particularly, the disclosure relates to an anti-fuse sensing device and an operation method thereof.

Description of Related Art

An anti-fuse may be applied to various electronic circuits. For example, a dynamic random-access memory (DRAM) chip uses the anti-fuse to determine to turn on which redundant row and/or redundant column. In terms of the anti-fuse, a blown anti-fuse has a low resistance, while an unblown anti-fuse has a high resistance. A sensing circuit may sense a resistance state of the anti-fuse. However, there inevitably exist temperature effects in semiconductor devices of the sensing circuit. Based on the temperature effects, a voltage provided by the sensing circuit to the anti-fuse at different temperatures may be drifted, and the drifted voltage may cause errors in the interpretation of the resistance state. For the DRAM chip, the erroneous interpretation of the resistance state of the anti-fuse may lead to erroneous turning-on of the redundant row and redundant column, affecting the yield of the DRAM chip.

SUMMARY

The disclosure provides an anti-fuse sensing device and an operation method thereof to compensate for influences of the temperature effects on a sensing circuit.

In an embodiment of the disclosure, the anti-fuse sensing device is adapted for sensing a resistance state of an anti-fuse. The anti-fuse sensing device includes a voltage generating circuit, a comparison circuit, and a sensing circuit. The voltage generating circuit is configured to generate a comparison voltage that changes with temperature. The comparison circuit is coupled to the voltage generating circuit to receive the comparison voltage. The comparison circuit is configured to compare the comparison voltage with a first reference voltage, and to convert a difference between the comparison voltage and the first reference voltage into a first bias voltage that changes with temperature. The sensing circuit is coupled to the comparison circuit to receive the first bias voltage. The sensing circuit is configured to sense the resistance state of the anti-fuse according to the first bias voltage.

In an embodiment of the disclosure, the operation method includes the following. A comparison voltage that changes with temperature is generated by a voltage generating circuit of the anti-fuse sensing device. A difference between the comparison voltage and a first reference voltage is converted by a comparison circuit of the anti-fuse sensing device into a first bias voltage that changes with temperature. The resistance state of the anti-fuse is sensed by a sensing circuit of the anti-fuse sensing device according to the first bias voltage.

Based on the foregoing, according to the embodiments of the disclosure, the anti-fuse sensing device may generate the first bias voltage that changes with temperature for the sensing circuit. Therefore, the anti-fuse sensing device can compensate for influences of the temperature effects on the sensing circuit.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

The term "coupling (or connection)" used throughout the specification (including the claims) of the application may refer to any direct or indirect connection means. For example, if it is described herein that a first device is coupled (or connected) to a second device, it should be interpreted that the first device may be directly connected to the second device, or the first device may be indirectly connected to the second device through other devices or a certain connection means. The terms "first" and "second" mentioned throughout the specification (including the claims) of the application are used to name the element, or to distinguish between different embodiments or scopes, and are not used to limit an upper bound or a lower bound of the number of elements, nor used to limit the sequence of elements. In addition, wherever possible, elements/members/steps using the same reference numerals in the drawings and embodiments represent the same or similar parts. Cross-reference may to made to relevant descriptions of elements/components/steps using the same reference numerals or using the same terms in different embodiments.

Figure 1:
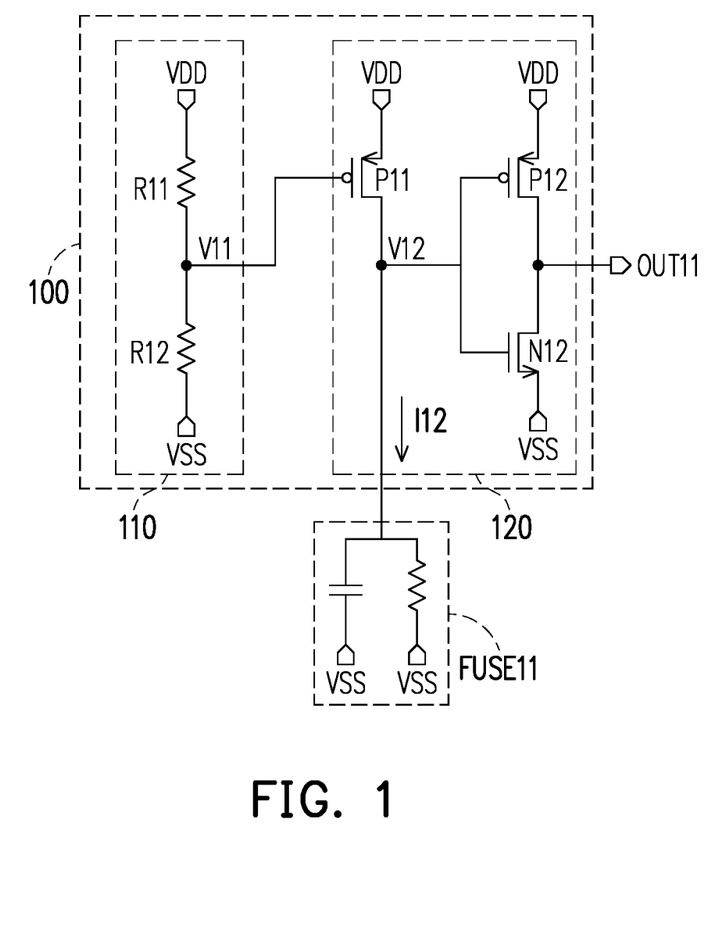
FIG. 1 is a schematic circuit block diagram of an anti-fuse sensing device according to an embodiment of the disclosure.

FIG. 1 is a schematic circuit block diagram of an anti-fuse sensing device 100 according to an embodiment of the disclosure. The anti-fuse sensing device 100 is adapted for sensing a resistance state (blown state) of an anti-fuse FUSE11. FIG. 1 shows the equivalent circuit of the anti-fuse FUSE11. The anti-fuse FUSE11 is a commonly known element, and is thus not repeatedly described herein. The anti-fuse sensing device 100 shown in FIG. 1 includes a voltage dividing circuit 110 and a sensing circuit 120. The voltage dividing circuit 110 includes resistors R11 and R12 connected in series between a system voltage VDD and a reference voltage VSS. The voltage dividing circuit 110 may divide the system voltage VDD to generate a bias voltage V11 for the sensing circuit 120.

The sensing circuit 120 shown in FIG. 1 includes transistors P11, P12, and N12. The transistors P11 and P12 are p-channel metal oxide semiconductor (PMOS) transistors, and the transistor N12 is an n-channel metal oxide semiconductor (NMOS) transistor. A control terminal (e.g., a gate) of the transistor P11 is coupled to the voltage dividing circuit 110 to receive the bias voltage V11. A first terminal (e.g., a source) of the transistor P11 is coupled to the system voltage VDD. A second terminal (e.g., a drain) of the transistor P11 is configured to be coupled to the anti-fuse FUSE11. A control terminal (e.g., a gate) of the transistor P12 is coupled to the second terminal of the transistor P11. A first terminal (e.g., a source) of the transistor P12 is coupled to the system voltage VDD. A control terminal (e.g., a gate) of the transistor N12 is coupled to the second terminal of the transistor P11. A first terminal (e.g., a source) of the transistor N12 is coupled to the reference voltage VSS. A second terminal (e.g., a drain) of the transistor N12 is coupled to a second terminal (e.g., a drain) of the transistor P12. The second terminal of the transistor N12 and the second terminal of the transistor P12 together provide a sensing result OUT11 regarding the anti-fuse FUSE11.

The voltage dividing circuit 110 may provide the bias voltage V11 to the gate of the transistor P11. Based on the bias voltage V11, the transistor P11 may provide a sensing current I12 to the anti-fuse FUSE11. The sensed resistance state of the anti-fuse FUSE11 may be reflected by a sensing voltage V12. When the anti-fuse FUSE11 is in the unblown state, the anti-fuse FUSE11 has a high resistance, so the sensing voltage V12 is at a high level, so that the sensing result OUT11 is logic "0". On the contrary, when the anti-fuse FUSE11 is in the blown state, the anti-fuse FUSE11 has a low resistance, so the sensing voltage V12 is at a low level, so that the sensing result OUT11 is logic "1". However, the bias voltage V11 hardly changes with temperature or process variation, but the threshold voltage (Vth) of the transistor P11 changes with temperature and process variation. In the case where the bias voltage V11 does not change, the change in the threshold voltage affects the change in the current of the transistor P11, which may lead to erroneously determining the resistance state of the anti-fuse FUSE11 (e.g., erroneously determining the blown state of the anti-fuse FUSE11 as unblown state).

Figure 2:
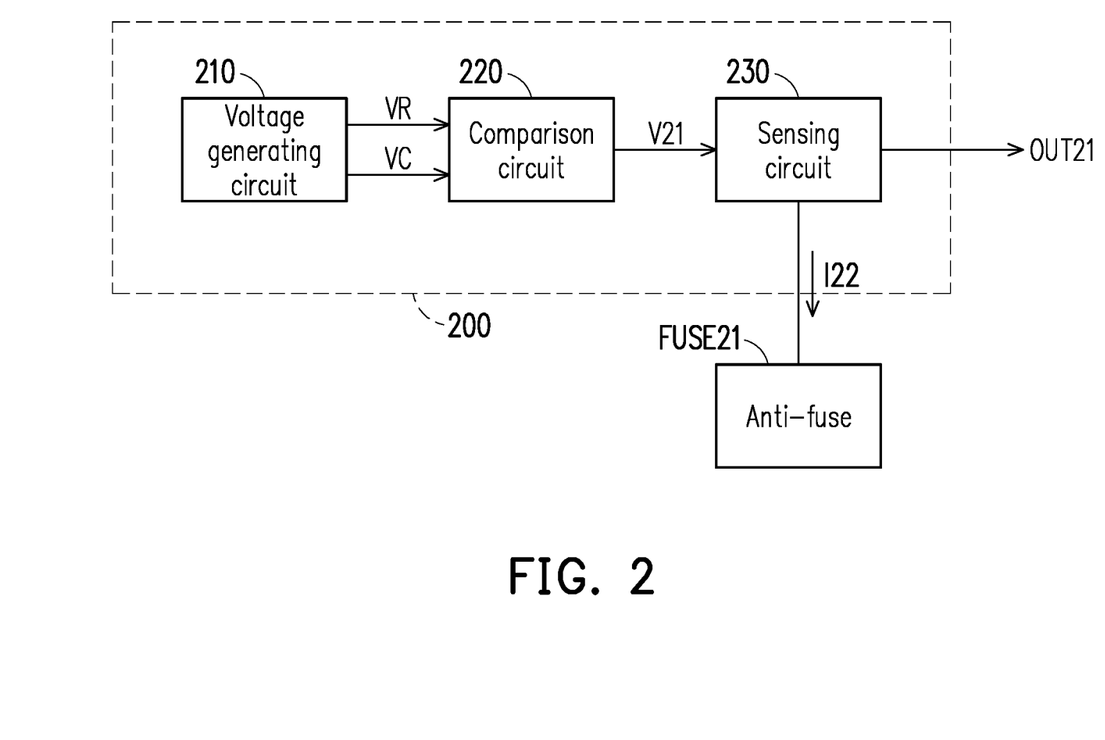
FIG. 2 is a schematic circuit block diagram of an anti-fuse sensing device according to an embodiment of the disclosure.

FIG. 2 is a schematic circuit block diagram of an anti-fuse sensing device 200 according to an embodiment of the disclosure. The anti-fuse sensing device 200 shown in FIG. 2 is adapted for sensing a resistance state (blown state) of an anti-fuse FUSE21. The anti-fuse FUSE21 shown in FIG. 2 may be deduced by analogy with reference to the relevant description of the anti-fuse FUSE11 shown in FIG. 1, and will thus not be repeatedly described. In the embodiment shown in FIG. 2, the anti-fuse sensing device 200 includes a voltage generating circuit 210, a comparison circuit 220, and a sensing circuit 230.

Figure 3:
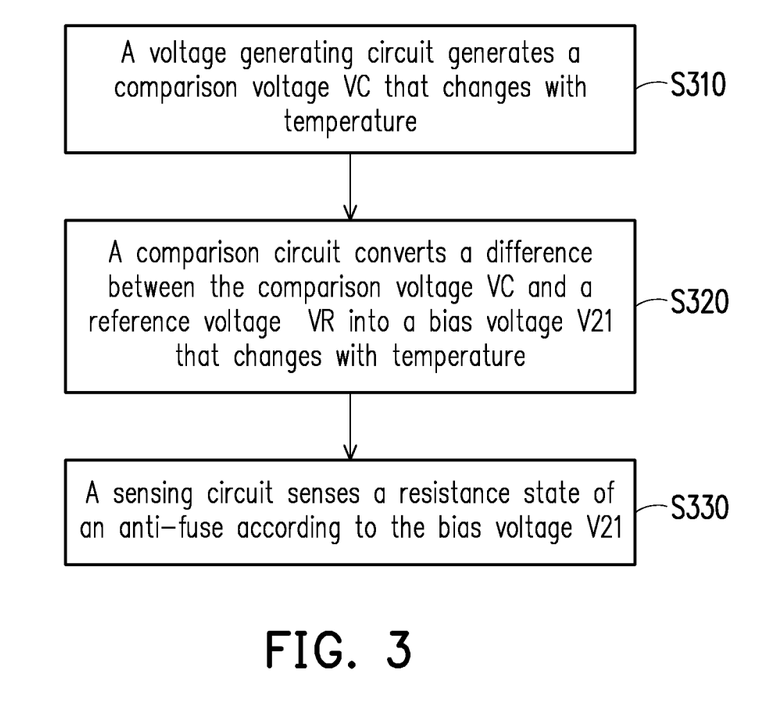
FIG. 3 is a schematic flowchart of an operation method of an anti-fuse sensing device according to an embodiment of the disclosure.

FIG. 3 is a schematic flowchart of an operation method of an anti-fuse sensing device according to an embodiment of the disclosure. With reference to FIG. 2 and FIG. 3, in step S310, the voltage generating circuit 210 may generate a comparison voltage VC that changes with temperature. For example, when the temperature rises, the comparison voltage VC increases accordingly. On the contrary, when the temperature drops, the comparison voltage VC decreases accordingly. The voltage generating circuit 210 may also provide a reference voltage VR to the comparison circuit 220. The reference voltage VR hardly changes with temperature or process variation. For example, the reference voltage VR may be deduced by analogy with reference to the relevant description of the bias voltage V11 shown in FIG. 1.

With reference to FIG. 2 and FIG. 3, the comparison circuit 220 is coupled to the voltage generating circuit 210 to receive the comparison voltage VC. In step S320, the comparison circuit 220 may compare the reference voltage VR and the comparison voltage VC, and convert a difference between the comparison voltage VC and the reference voltage VR into a bias voltage V21 that changes with temperature. For example, the bias voltage V21 may increase with increasing temperature, and the bias voltage V21 may decrease with decreasing temperature. The sensing circuit 230 is coupled to the comparison circuit 220 to receive the bias voltage V21. Based on the bias voltage V21, the sensing circuit 230 may provide a sensing current I22 to the anti-fuse FUSE21. The sensing current I22 shown in FIG. 2 may be deduced by analogy with reference to the relevant description of the sensing current I12 shown in FIG. 1, and will thus not be repeatedly described.

In step S330, the sensing circuit 230 may sense the resistance state (blown state) of the anti-fuse FUSE21 according to the bias voltage V21. When the anti-fuse FUSE21 has a high resistance (unblown state), a sensing result OUT21 is logic "0". On the contrary, when the anti-fuse FUSE21 has a low resistance (blown state), the sensing result OUT21 is logic "1". The sensing circuit 230 shown in FIG. 2 may be deduced by analogy with reference to the relevant description of the sensing circuit 120 shown in FIG. 1, and will thus not be repeatedly described.

In summary, the anti-fuse sensing device 200 may generate the bias voltage V21 that changes with temperature for the sensing circuit 230. When the temperature rises, the threshold voltage of the transistor of the sensing circuit 230 decreases accordingly, but the bias voltage V21 may increase with the temperature to compensate for the influence of the temperature on the sensing current I22. When the temperature drops, the threshold voltage of the transistor of the sensing circuit 230 increases accordingly, but the bias voltage V21 may decrease with the temperature to compensate for the influence of the temperature on the sensing current I22. Therefore, the anti-fuse sensing device 200 can compensate for influences of the temperature effects on the sensing circuit 230.

Figure 4:
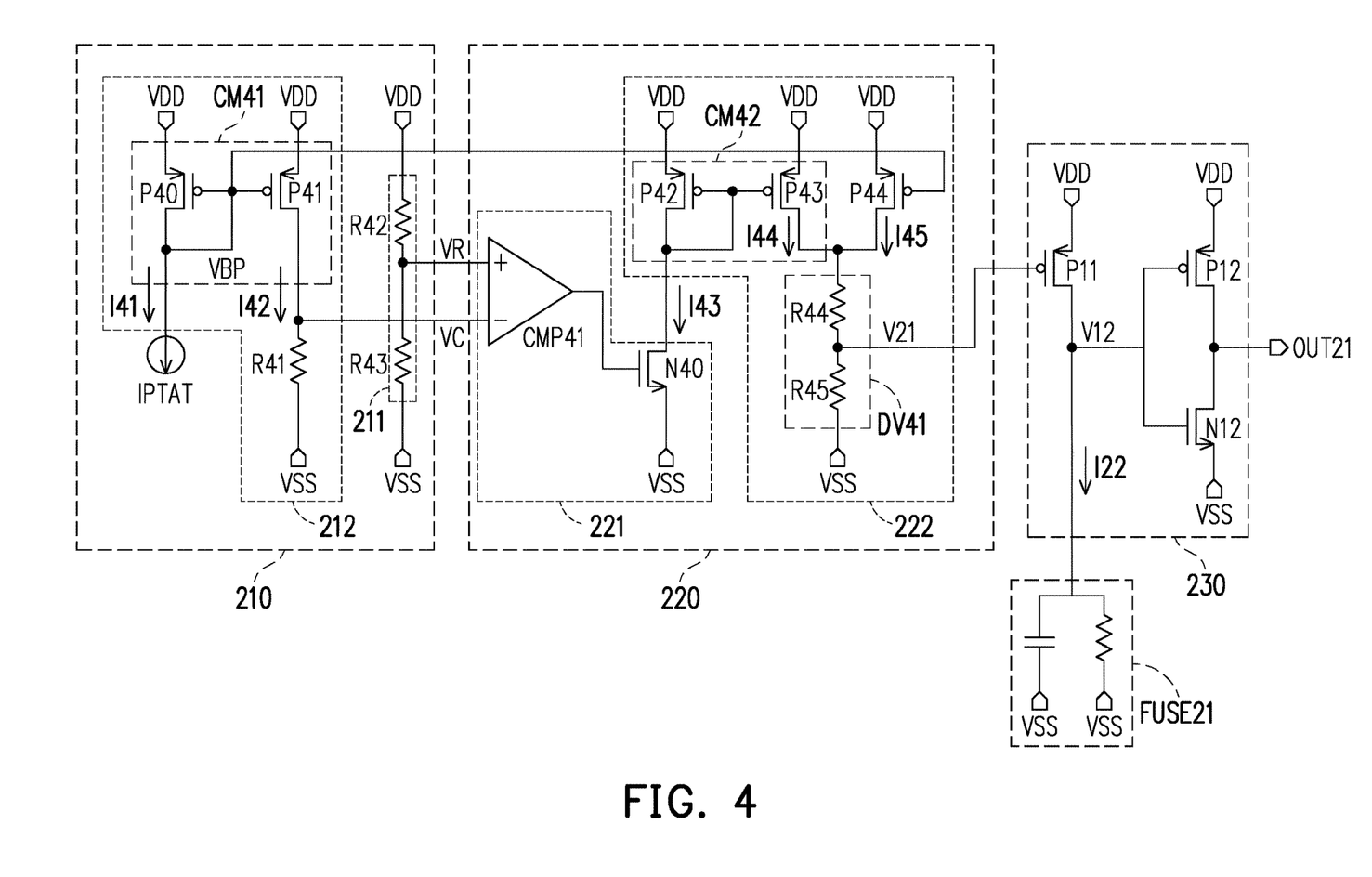
FIG. 4 is a schematic circuit block diagram illustrating the voltage generating circuit, the comparison circuit, and the sensing circuit shown in FIG. 2 according to an embodiment of the disclosure.

FIG. 4 is a schematic circuit block diagram illustrating the voltage generating circuit 210, the comparison circuit 220, and the sensing circuit 230 shown in FIG. 2 according to an embodiment of the disclosure. For the voltage generating circuit 210, the comparison circuit 220, the sensing circuit 230, and the anti-fuse FUSE 21 shown in FIG. 4, reference may be made to the relevant descriptions of FIG. 2 and FIG. 3.

In the embodiment shown in FIG. 4, the voltage generating circuit 210 includes a voltage dividing circuit 211, a current-voltage converting circuit 212, and a positive temperature coefficient current source IPTAT. The voltage dividing circuit 211 shown in FIG. 4 includes resistors R42 and R43 connected in series between the system voltage VDD and the reference voltage VSS. The voltage dividing circuit 211 may divide the system voltage VDD to generate the reference voltage VR for the comparison circuit 220. The level of the reference voltage VR may be determined depending on the actual design. The reference voltage VR hardly changes with temperature or process variation. The positive temperature coefficient current source IPTAT is coupled to the current-voltage converting circuit 212 to sink a positive temperature coefficient current I41. The positive temperature coefficient current I41 may increase with increasing temperature. The current-voltage converting circuit 212 may convert the positive temperature coefficient current I41 into the comparison voltage VC. Therefore, the comparison voltage VC may change with temperature. The level of the comparison voltage VC may be determined depending on the actual design. For example, the comparison voltage VC may be less than the reference voltage VR.

In the embodiment shown in FIG. 4, the current-voltage converting circuit 212 includes a current mirror CM41 and a resistor R41. The positive temperature coefficient current source IPTAT is coupled to a master current terminal of the current mirror CM41 to sink the positive temperature coefficient current I41. The current mirror CM41 generates a mirrored current I42 according to the positive temperature coefficient current I41. The current mirror CM41 shown in FIG. 4 includes transistors P40, P41, and P44, and the transistors P40, P41, and P44 are PMOS transistors. First terminals (e.g., sources) of the transistors P40, P41, and P44 are coupled to the system voltage VDD. A second terminal (e.g., a drain) of the transistor P40 is coupled to control terminals (e.g., gates) of the transistors P40, P41, and P44 to provide a bias voltage VBP. The second terminal of the transistor P40 is further coupled to the master current terminal of the current mirror CM41. A second terminal (e.g., a drain) of the transistor P41 is coupled to a slave current terminal of the current mirror CM41. A first terminal of the resistor R41 is coupled to the slave current terminal of the current mirror CM41 to receive the mirrored current I42. A second terminal of the resistor R41 is coupled to the reference voltage VSS. The first terminal of the resistor R41 is further coupled to the comparison circuit 220 to provide the comparison voltage VC.

In the embodiment shown in FIG. 4, the comparison circuit 220 includes a voltage-current converting circuit 221 and a current-voltage converting circuit 222. The voltage-current converting circuit 221 is coupled to the voltage generating circuit 210 to receive the comparison voltage VC and the reference voltage VR. The voltage-current converting circuit 221 may compare the reference voltage VR and the comparison voltage VC, and convert the difference between the comparison voltage VC and the reference voltage VR into a converted current I43 that changes with temperature. In the embodiment shown in FIG. 4, the voltage-current converting circuit 221 includes a voltage comparator CMP41 and a transistor N40, and the transistor N40 is an NMOS transistor. A first input terminal (e.g., a non-inverting input terminal) of the voltage comparator CMP41 is coupled to the voltage generating circuit 210 to receive the reference voltage VR. A second input terminal (e.g., an inverting input terminal) of the voltage comparator CMP41 is coupled to the voltage generating circuit 210 to receive the comparison voltage VC. A control terminal (e.g., a gate) of the transistor N40 is coupled to an output terminal of the voltage comparator CMP41. A first terminal (e.g., a source) of the transistor N40 is coupled to the reference voltage VSS. A second terminal (e.g., a drain) of the transistor N40 is coupled to the current-voltage converting circuit 222 to sink the current I43.

The voltage-current converting circuit 221 is coupled to the current-voltage converting circuit 222 to sink the converted current I43. The current-voltage converting circuit 222 converts the converted current I43 into the bias voltage V21. In the embodiment shown in FIG. 4, the current-voltage converting circuit 222 includes a current mirror CM42, a voltage dividing circuit DV41, and the transistor P44. The voltage-current converting circuit 221 is coupled to a master current terminal of the current mirror CM42 to sink the converted current I43. The current mirror CM42 may generate a mirrored current I44 according to the converted current I43. The current mirror CM42 shown in FIG. 4 includes transistors P42 and P43, and the transistors P42 and P43 are PMOS transistors. First terminals (e.g., sources) of the transistors P42 and P43 are coupled to the system voltage VDD. A second terminal (e.g., a drain) of the transistor P42 is coupled to control terminals (e.g., gates) of the transistors P42 and P43. The second terminal of the transistor P42 is further coupled to the master current terminal of the current mirror CM42. A second terminal (e.g., a drain) of the transistor P43 is coupled to a slave current terminal of the current mirror CM42.

Based on the comparison operation of the voltage comparator CMP41, when the temperature rises, the transistor N40 reduces the converted current I43, so that the bias voltage V21 obtains a smaller compensation voltage. On the contrary, when the temperature drops, the bias voltage V21 obtains a larger compensation voltage. Therefore, the anti-fuse sensing device 200 may perform temperature compensation on the bias voltage V21 to accurately control the voltage range.

The control terminal (e.g., the gate) of the transistor P44 is under control of the bias voltage VBP of the voltage generating circuit 210. The first terminal (e.g., the source) of the transistor P44 is coupled to the system voltage VDD. A first terminal of the voltage dividing circuit DV41 is coupled to a second terminal (e.g., a drain) of the transistor P44 to receive a mirrored current I45. The first terminal of the voltage dividing circuit DV41 is coupled to the slave current terminal of the current mirror CM42 to receive the mirrored current I44. The voltage dividing circuit DV41 shown in FIG. 4 includes resistors R44 and R45. A first terminal of the resistor R44 is coupled to the slave current terminal of the current mirror CM42 and the second terminal of the transistor P44. A second terminal of the resistor R44 is coupled to a first terminal of the resistor R45. A second terminal of the resistor R45 is coupled to the reference voltage VSS. The voltage dividing circuit DV41 may generate the bias voltage V21 for the sensing circuit 230.

Based on the transistors P40 and P44 of the current mirror, when the process variation falls on the FF corner, the transistor P44 increases the mirrored current I45, so that the bias voltage V21 obtains a larger compensation voltage. On the contrary, when the process variation falls on the SS corner, the transistor P44 reduces the mirrored current I45, so that the bias voltage V21 obtains a smaller compensation voltage. Therefore, the anti-fuse sensing device 200 may perform process variation compensation on the bias voltage V21 to accurately control the voltage range.

In the embodiment shown in FIG. 4, the sensing circuit 230 includes the transistor P11, the transistor P12, and the transistor N12. The control terminal of the transistor P11 is coupled to the comparison circuit 220 to receive the bias voltage V21. The first terminal of the transistor P11 is coupled to the system voltage VDD. The second terminal of the transistor P11 is configured to be coupled to the anti-fuse FUSE21. The control terminals of the transistor P12 and the transistor N12 are coupled to the second terminal of the transistor P11. The first terminal of the transistor P12 is coupled to the system voltage VDD. The first terminal of the transistor N12 is coupled to the reference voltage VSS. The second terminal of the transistor N12 is coupled to the second terminal of the transistor P12. The second terminal of the transistor N12 and the second terminal of the transistor P12 together provide the sensing result OUT21 regarding the anti-fuse FUSE21. The sensing circuit 230 and the anti-fuse FUSE 21 shown in FIG. 2 may be deduced by analogy with reference to the relevant descriptions of the sensing circuit 120 and the anti-fuse FUSE 11 shown in FIG. 1.

Figure 5:
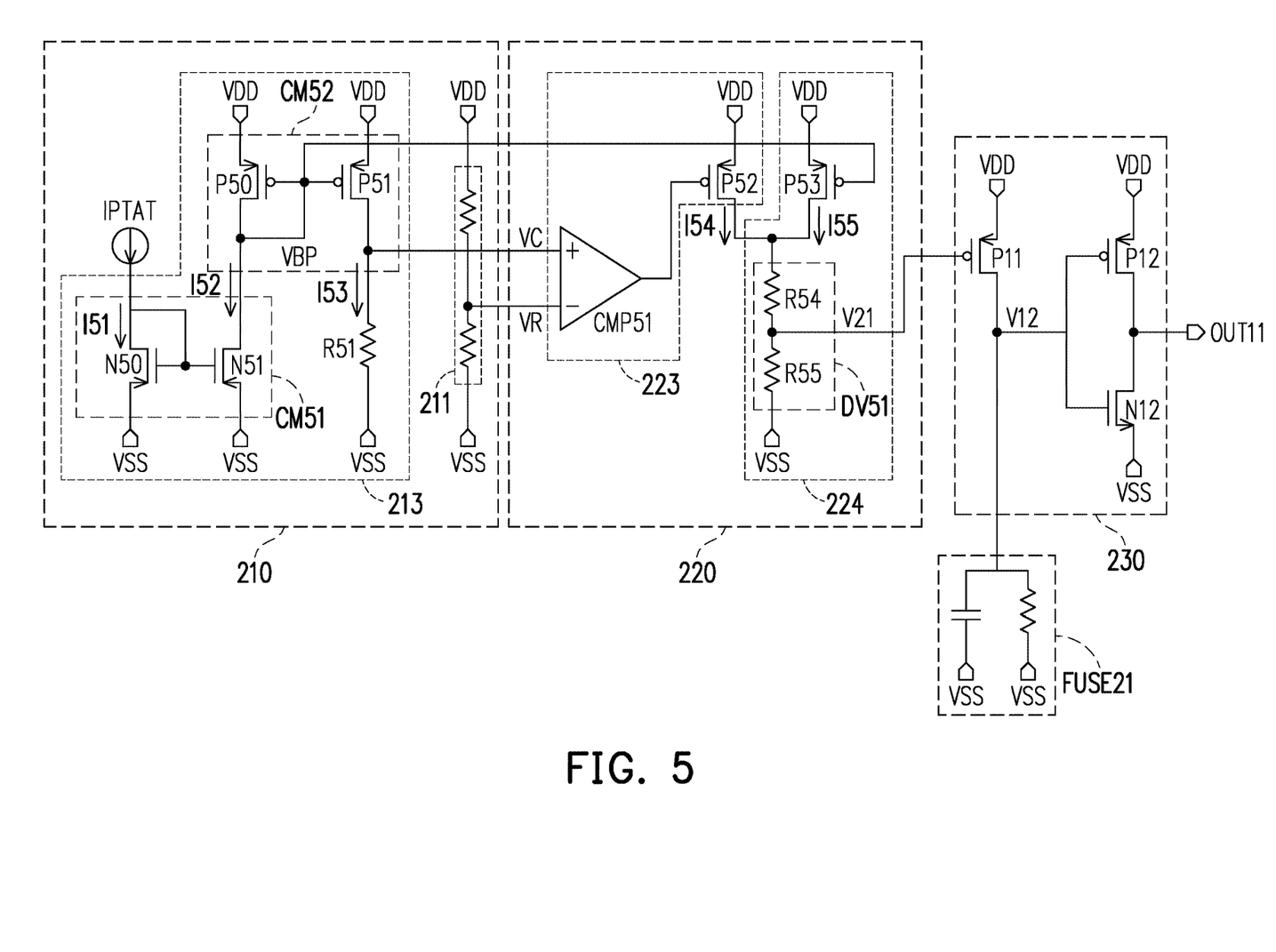
FIG. 5 is a schematic circuit block diagram illustrating the voltage generating circuit, the comparison circuit, and the sensing circuit shown in FIG. 2 according to another embodiment of the disclosure.

FIG. 5 is a schematic circuit block diagram illustrating the voltage generating circuit 210, the comparison circuit 220, and the sensing circuit 230 shown in FIG. 2 according to another embodiment of the disclosure. For the voltage generating circuit 210, the comparison circuit 220, the sensing circuit 230, and the anti-fuse FUSE 21 shown in FIG. 5, reference may be made to the relevant descriptions of FIG. 2 and FIG. 3.

In the embodiment shown in FIG. 5, the voltage generating circuit 210 includes the voltage dividing circuit 211, a current-voltage converting circuit 213, and the positive temperature coefficient current source IPTAT. The voltage dividing circuit 211 and the positive temperature coefficient current source IPTAT shown in FIG. 5 may be deduced by analogy with reference to the relevant descriptions of the voltage dividing circuit 211 and the positive temperature coefficient current source IPTAT shown in FIG. 4, and will thus not be repeatedly described. The current-voltage converting circuit 213 is coupled to the positive temperature coefficient current source IPTAT to receive a positive temperature coefficient current I51. The positive temperature coefficient current I51 may increase with increasing temperature. The current-voltage converting circuit 213 may convert the positive temperature coefficient current I51 into the comparison voltage VC. Therefore, the comparison voltage VC may change with temperature. The levels of the comparison voltage VC and the reference voltage VR may be determined depending on the actual design. For example, the comparison voltage VC may be less than the reference voltage VR.

In the embodiment shown in FIG. 5, the current-voltage converting circuit 213 includes a current mirror CM51, a current mirror CM52, and a resistor R51. A master current terminal of the current mirror CM51 is coupled to the positive temperature coefficient current source IPTAT to receive the positive temperature coefficient current I51. The current mirror CM51 may sink a mirrored current I52 according to the positive temperature coefficient current I51. The current mirror CM51 shown in FIG. 5 includes transistors N50 and N51, and the transistors N50 and N51 are NMOS transistors. First terminals (e.g., sources) of the transistors N50 and N51 are coupled to the reference voltage VSS. A second terminal (e.g., a drain) of the transistor N50 is coupled to control terminals (e.g., gates) of the transistors N50 and N51. The second terminal of the transistor N50 is further coupled to the master current terminal of the current mirror CM51. A second terminal (e.g., a drain) of the transistor N51 is coupled to a slave current terminal of the current mirror CM51.

The slave current terminal of the current mirror CM51 is coupled to a master current terminal of the current mirror CM52 to sink the mirrored current I52. The current mirror CM52 may generate a mirrored current I53 according to the mirrored current I52. The current mirror CM52 shown in FIG. 5 includes transistors P50, P51, and P53, and the transistors P50, P51, and P53 are PMOS transistors. First terminals (e.g., sources) of the transistors P50, P51, and P53 are coupled to the system voltage VDD. A second terminal (e.g., a drain) of the transistor P50 is coupled to control terminals (e.g., gates) of the transistors P50, P51, and P53 to provide the bias voltage VBP. The second terminal of the transistor P50 is further coupled to the master current terminal of the current mirror CM52. A second terminal (e.g., a drain) of the transistor P51 is coupled to a slave current terminal of the current mirror CM52. A first terminal of the resistor R51 is coupled to the slave current terminal of the current mirror CM52 to receive the mirrored current I53. A second terminal of the resistor R51 is coupled to the reference voltage VSS. The first terminal of the resistor R51 is further coupled to the comparison circuit 220 to provide the comparison voltage VC.

In the embodiment shown in FIG. 5, the comparison circuit 220 includes a voltage-current converting circuit 223 and a current-voltage converting circuit 224. The voltage-current converting circuit 223 and the current-voltage converting circuit 224 shown in FIG. 5 may be deduced by analogy with reference to the relevant descriptions of the voltage-current converting circuit 221 and the current-voltage converting circuit 222 shown in FIG. 4, and will thus not be repeatedly described. In the embodiment shown in FIG. 5, the voltage-current converting circuit 223 includes a voltage comparator CMP51 and a transistor P52, and the transistor P52 is a PMOS transistor. A first input terminal (e.g., a non-inverting input terminal) of the voltage comparator CMP51 is coupled to the voltage generating circuit 210 to receive the comparison voltage VC. A second input terminal (e.g., an inverting input terminal) of the voltage comparator CMP51 is coupled to the voltage generating circuit 210 to receive the reference voltage VR. A control terminal (e.g., a gate) of the transistor P52 is coupled to an output terminal of the voltage comparator CMP51. A first terminal (e.g., a source) of the transistor P52 is coupled to the system voltage VDD. A second terminal (e.g., a drain) of the transistor P52 is coupled to the current-voltage converting circuit 224 to provide a converted current I54.

In the embodiment shown in FIG. 5, the current-voltage converting circuit 224 includes a voltage dividing circuit DV51 and the transistor P53. The control terminal (e.g., the gate) of the transistor P53 is under control of the bias voltage VBP of the voltage generating circuit 210. The first terminal (e.g., the source) of the transistor P53 is coupled to the system voltage VDD. A first terminal of the voltage dividing circuit DV51 is coupled to a second terminal (e.g., a drain) of the transistor P53 to receive a mirrored current I55. The first terminal of the voltage dividing circuit DV51 is coupled to the voltage-current converting circuit 223 to receive the converted current I54. The voltage dividing circuit DV51 shown in FIG. 5 includes a resistor R54 and a resistor R55. A first terminal of the resistor R54 is coupled to the voltage-current converting circuit 223 and the second terminal of the transistor P53. A second terminal of the resistor R54 is coupled to a first terminal of the resistor R55. A second terminal of the resistor R55 is coupled to the reference voltage VSS. The voltage dividing circuit DV51 may generate the bias voltage V21 for the sensing circuit 230.

Based on the comparison operation of the voltage comparator CMP51, when the temperature rises, the transistor P52 reduces the converted current I54, so that the bias voltage V21 obtains a smaller compensation voltage. On the contrary, when the temperature drops, the bias voltage V21 obtains a larger compensation voltage. Therefore, the anti-fuse sensing device 200 may perform temperature compensation on the bias voltage V21 to accurately control the voltage range. Based on the transistors P50 and P53 of the current mirror, when the process variation falls on the FF corner, the transistor P53 increases the mirrored current I55, so that the bias voltage V21 obtains a larger compensation voltage. On the contrary, when the process variation falls on the SS corner, the transistor P53 reduces the mirrored current I55, so that the bias voltage V21 obtains a smaller compensation voltage. Therefore, the anti-fuse sensing device 200 may perform process variation compensation on the bias voltage V21 to accurately control the voltage range.

In summary of the foregoing, the anti-fuse sensing device 200 according to the above embodiments may generate the bias voltage V21 that changes with temperature for the sensing circuit 230. The bias voltage V21 generated after temperature and process variation compensations is utilized to reduce influences of temperature and process variation on the sensing current I22 of the transistor P11, thus accurately controlling the variation range of the sensing voltage V12. Therefore, the anti-fuse sensing device 200 can compensate for influences of the temperature effects on the sensing circuit and prevent erroneous determination of the resistance state (blown state) of the anti-fuse FUSE21.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An anti-fuse sensing device, adapted for sensing a resistance state of an anti-fuse, the anti-fuse sensing device comprising:
    a voltage generating circuit configured to generate a comparison voltage that changes with temperature;
    a comparison circuit coupled to the voltage generating circuit to receive the comparison voltage, and configured to compare the comparison voltage with a first reference voltage, and to convert a difference between the comparison voltage and the first reference voltage into a first bias voltage that changes with temperature; and
    a sensing circuit coupled to the comparison circuit to receive the first bias voltage, and configured to sense the resistance state of the anti-fuse according to the first bias voltage.

2. The anti-fuse sensing device according to claim 1, wherein the first bias voltage increases with increasing temperature, and the first bias voltage decreases with decreasing temperature.

3. The anti-fuse sensing device according to claim 1, wherein the voltage generating circuit comprises:
    a voltage dividing circuit configured to divide a system voltage to generate the first reference voltage;
    a positive temperature coefficient current source configured to sink a positive temperature coefficient current; and
    a current-voltage converting circuit coupled to the positive temperature coefficient current source, and configured to convert the positive temperature coefficient current into the comparison voltage.

4. The anti-fuse sensing device according to claim 3, wherein the current-voltage converting circuit comprises:
    a current mirror, wherein the positive temperature coefficient current source is coupled to a master current terminal of the current mirror to sink the positive temperature coefficient current, and the current mirror generates a mirrored current according to the positive temperature coefficient current; and
    a resistor having a first terminal coupled to a slave current terminal of the current mirror to receive the mirrored current, wherein a second terminal of the resistor is coupled to a second reference voltage, and the first terminal of the resistor is further coupled to the comparison circuit to provide the comparison voltage.

5. The anti-fuse sensing device according to claim 1, wherein the voltage generating circuit comprises:
    a voltage dividing circuit configured to divide a system voltage to generate the first reference voltage;
    a positive temperature coefficient current source configured to provide a positive temperature coefficient current; and
    a current-voltage converting circuit coupled to the positive temperature coefficient current source to receive the positive temperature coefficient current, and configured to convert the positive temperature coefficient current into the comparison voltage.

6. The anti-fuse sensing device according to claim 5, wherein the current-voltage converting circuit comprises:
    a first current mirror having a first master current terminal coupled to the positive temperature coefficient current source to receive the positive temperature coefficient current, and configured to sink a first mirrored current according to the positive temperature coefficient current;
    a second current mirror, wherein a first slave current terminal of the first current mirror is coupled to a second master current terminal of the second current mirror to sink the first mirrored current, and the second current mirror is configured to generate a second mirrored current according to the first mirrored current; and
    a resistor having a first terminal coupled to a second slave current terminal of the second current mirror to receive the second mirrored current, wherein a second terminal of the resistor is coupled to a second reference voltage, and the first terminal of the resistor is further coupled to the comparison circuit to provide the comparison voltage.

7. The anti-fuse sensing device according to claim 1, wherein the comparison circuit comprises:
    a voltage-current converting circuit coupled to the voltage generating circuit to receive the comparison voltage, and configured to compare the comparison voltage with the first reference voltage, and convert the difference between the comparison voltage and the first reference voltage into a converted current that changes with temperature; and
    a current-voltage converting circuit, wherein the voltage-current converting circuit is coupled to the current-voltage converting circuit to sink the converted current, and the current-voltage converting circuit converts the converted current into the first bias voltage.

8. The anti-fuse sensing device according to claim 7, wherein the voltage-current converting circuit comprises:
    a voltage comparator having a first input terminal configured to receive the first reference voltage, wherein a second input terminal of the voltage comparator is coupled to the voltage generating circuit to receive the comparison voltage; and
    a transistor having a control terminal coupled to an output terminal of the voltage comparator, wherein a first terminal of the transistor is coupled to a second reference voltage, and a second terminal of the transistor is coupled to the current-voltage converting circuit to sink the converted current.

9. The anti-fuse sensing device according to claim 7, wherein the current-voltage converting circuit comprises:
    a current mirror, wherein the voltage-current converting circuit is coupled to a master current terminal of the current mirror to sink the converted current, and the current mirror generates a mirrored current according to the converted current; and a voltage dividing circuit having a first terminal coupled to a slave current terminal of the current mirror to receive the mirrored current, and configured to generate the first bias voltage according to the mirrored current.

10. The anti-fuse sensing device according to claim 9, wherein the current-voltage converting circuit further comprises:

a transistor having a control terminal controlled by a second bias voltage of the voltage generating circuit, wherein a first terminal of the transistor is coupled to a system voltage, and the first terminal of the voltage dividing circuit is further coupled to a second terminal of the transistor.

11. The anti-fuse sensing device according to claim 7, wherein the voltage-current converting circuit comprises:

a voltage comparator having a first input terminal coupled to the voltage generating circuit to receive the comparison voltage, wherein a second input terminal of the voltage comparator is configured to receive the first reference voltage; and a transistor having a control terminal coupled to an output terminal of the voltage comparator, wherein a first terminal of the transistor is coupled to a system voltage, and a second terminal of the transistor is coupled to the current-voltage converting circuit to provide the converted current.

12. The anti-fuse sensing device according to claim 7, wherein the current-voltage converting circuit comprises:

a voltage dividing circuit having a first terminal coupled to the voltage-current converting circuit to receive the converted current, and configured to generate the first bias voltage according to the converted current.

13. The anti-fuse sensing device according to claim 12, wherein the current-voltage converting circuit further comprises:

a transistor having a control terminal controlled by a second bias voltage of the voltage generating circuit, wherein a first terminal of the transistor is coupled to a system voltage, and the first terminal of the voltage dividing circuit is further coupled to a second terminal of the transistor.

14. The anti-fuse sensing device according to claim 1, wherein the sensing circuit comprises:

a first transistor having a control terminal coupled to the comparison circuit to receive the first bias voltage, wherein a first terminal of the first transistor is coupled to a system voltage, and a second terminal of the first transistor is coupled to the anti-fuse;

a second transistor having a control terminal coupled to the second terminal of the first transistor, wherein a first terminal of the second transistor is coupled to the system voltage; and a third transistor having a control terminal coupled to the second terminal of the first transistor, wherein a first terminal of the third transistor is coupled to a second reference voltage, and a second terminal of the third transistor is coupled to a second terminal of the second transistor.

15. An operation method of an anti-fuse sensing device, wherein the anti-fuse sensing device is adapted for sensing a resistance state of an anti-fuse, and the operation method comprises:

generating a comparison voltage that changes with temperature by a voltage generating circuit of the anti-fuse sensing device;

converting a difference between the comparison voltage and a first reference voltage into a first bias voltage that changes with temperature by a comparison circuit of the anti-fuse sensing device; and sensing the resistance state of the anti-fuse according to the first bias voltage by a sensing circuit of the anti-fuse sensing device.

16. The operation method according to claim 15, wherein the first bias voltage increases with increasing temperature, and the first bias voltage decreases with decreasing temperature.

\* \* \* \* \*